US005235348A

United States Patent [19]

Avonts

[11] Patent Number: 5,235,348

[45] Date of Patent: Aug. 10, 1993

[54] LED EXPOSURE HEAD

[75] Inventor: Kris P. Avonts, Meerhout, Belgium

[73] Assignee: AGFA-Gevaert N. V., Mortsel, Belgium

[21] Appl. No.: 723,244

[22] Filed: Jun. 28, 1991

[30] Foreign Application Priority Data

Jul. 3, 1990 [EP] European Pat. Off. ........ 90201778.9

[51] Int. Cl.[5] ........................ G01D 15/14; H02B 1/00; H05K 5/04

[52] U.S. Cl. ........................... 346/107 R; 346/139 R; 346/145; 361/704; 361/730; 361/752

[58] Field of Search ............... 346/107 R, 139 R, 145, 346/155, 160; 361/392, 394, 386, 388, 395, 399

[56] References Cited

U.S. PATENT DOCUMENTS 4,703,334 10/1987 Mochimaru et al. ............... 346/160
4,829,321 5/1989 Iizuka et al. ..................... 346/107 R
4,875,057 10/1989 Hediger et al. ................. 346/107 R
4,875,153 10/1989 Hons .................................. 346/155
4,942,405 7/1990 Dody et al. ...................... 346/107 R
5,036,339 7/1991 Hediger .......................... 346/107 R
5,105,202 4/1992 Hewes ................................ 346/1.1

FOREIGN PATENT DOCUMENTS 0048383 3/1985 Japan ............................. 346/139 R

*Primary Examiner*—Benjamin R. Fuller
*Assistant Examiner*—David Yockey
*Attorney, Agent, or Firm*—William J. Daniel

[57] ABSTRACT

A housing for a light emitting diode recording head used for linewise recording information on a photoreceptor in a recording apparatus is constituted by elongated extrusion molded base and cover sections held together in a unitary structure by injection molded and closure members. The cover section has opposed inclined side walls engaged at their diverging margins on the base section and defining at their converging margins an elongated slot for receiving the lens array of the head. Preferably, the cover section is formed of two identical subsections with their converging margins held apart by an inner leg on each end member to define said slot. The end members and/or the ends of the base section can carry projections to facilitate accurate mounting of the head in the apparatus. The inner surfaces of the cover section can be contoured to provide sealing surfaces for cooperation with a sealing bead of resilient material surrounding the electrical components within the head.

13 Claims, 4 Drawing Sheets

LED EXPOSURE HEAD

BACKGROUND OF THE INVENTION

1. Field of the Invention

Figure 1:
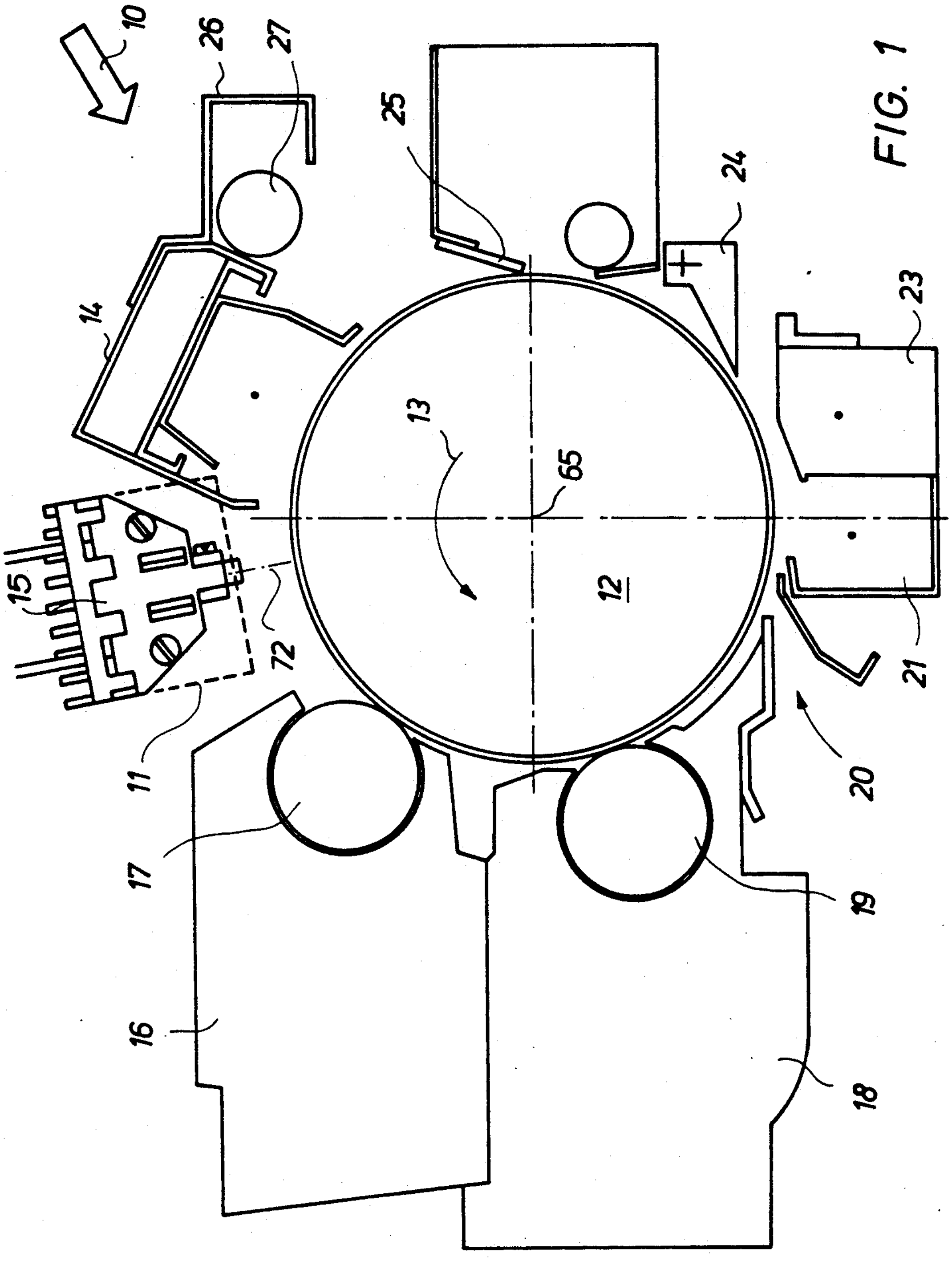

The present invention relates to a LED (light-emitting diode) exposure head for use in a recording apparatus for linewise recording information on a moving photoreceptor.

2. Description of the Prior Art

A LED exposure head is known that comprises an assembly in alignment of a plurality of LED modules mounted on a common base, and an elongated lens array parallel to the row of LED's. The head is mounted in a rigid housing which allows the mounting of the head in the recording apparatus and which also offers protection of the optical and electronic components against harmful environmental conditions.

The housings of known exposure heads consist of two injection moulded light-alloy parts that closely fit together to form a closed housing. One part usually has a peripheral groove and the other one a peripheral lip which cooperate, occasionally with an appropriate sealant, to form an effective seal of the housing. Disadvantages of such housing are their expense and their outer dimensions, in particular their width. A reduced width of the housing is important, in particular in those instances where two or more color developments must be performed around the semiconductor drum of the recording apparatus. A color developing station requires quite considerable angular space around a semiconductor drum and this space is difficult to reduce.

It is easy to obtain a larger angular space for the different components by using a semiconductor drum of a large diameter, but this adds to the expense of size of the recording apparatus.

SUMMARY OF THE INVENTION

Object of the Invention

It is one object of the invention to provide a LED exposure head which is compact, notably as regards its width, and which in spite of the absence of an outer peripheral seal, still achieves satisfactory protection of the inner electronic and optic components.

It is another object of the invention to provide a LED exposure head which has a housing that is cheap to manufacture and that allows the integration of a number of functions in the positioning and the adjustment of the exposure head.

According to the present invention, a LED exposure head for use in a recording apparatus for linewise recording information on a moving photoreceptor, comprises at least one row of closely spaced LED's and an elongated lens array parallel to the row(s) of LED's for exposure of the images of the LED's on the photoreceptor, said exposure head being mounted in a housing which allows the mounting of the head in the recording apparatus and which offers protection of the optic and electronic components against environmental conditions, wherein the housing is composed of at least two extrusion-moulded elongated sections and two injection-moulded end members, at least one of said at least tow elongated sections constituting the cover and the other constituting the base of the housing onto which the different LED's are mounted side by side, the end members being arranged for fixing the cover to the base and also for cooperation with a mount on a wall of the apparatus for the adjustment of the correct position of the exposure head in the recording apparatus.

The term "recording apparatus" as used in the present specification stands for a xerographic non-impact printer in which an electrostatic charge is applied onto the surface of a moving photoreceptor in the form of a drum or belt and selected areas of the surface are discharged by exposure to light. A developer tones is applied to the surface and adheres to the areas having an electrostatic charge. The toner image is then transferred to a sheet of plain paper or the like and heat-fused to form a permanent image. The toner image may also be transferred to a support that will serve as a master in the production of copies by offset printing.

However, the term "recording apparatus" stands also for a copies in which an original image is optically scanned to produce an electronic image signal which then may be controlled for density range, density variation, etc. before it is applied to an exposure head for printing the copy of the original.

The term "photoreceptor" stands for a photoconductive drum, but covers also a member in the shape of an endless belt that is conducted along a well-determined path past the exposure head.

The advantage of cheap manufacture of the exposure head results from the use of extruded sections. If only one extruded section were used for the cover, it is necessary to mill an elongated slot in said section for the location of a slotlike lens array in the exposure head for exposing the images of the LED's onto the photoreceptor.

Therefore, according to a suitable embodiment of the invention, the cover of the exposure head is made from two identical elongate sections that are assembled in opposed, reversed relationship, and the end members are arranged for connecting these sections together in parallel relationship which leaving elongaged slot-like opening for a lens array. Common assembly technology no longer requires the provision of threaded bores for the assembling screws of the cover, since by the provision of appropriate channels in the extruded sections, self-tapping screws may be used for fastening the end members to the sections.

The different elongaged sections are preferably extruded from a light alloy such as aluminium.

The base is preferably formed by a section with a sufficient mass and stiffness, since it forms in fact the foundation of the exposure head, and it is also responsible for the evacuation of heat produced by the LED's and/or their related circuitry.

The sections forming the cover are suitably provided with an inner wall that runs parallel with the base and that allows a resilient peripheral bead to be provided between the base section, more in particular between the electronic circuitry mounted thereon, and such inner walls, to constitute a seal against environmental conditions.

The end members are suitably formed to perform the functions of guiding the exposure head for its displacement relative to the photoreceptor, cooperating with adjustment screws for controlling the exact position of the exposure head, providing a protuberance that projects outwardly from the slot-like opening of the cover to protect the elongated lens array against damage resulting from occasional contact of the front of the head with the photoreceptor, etc.

Figure 2:
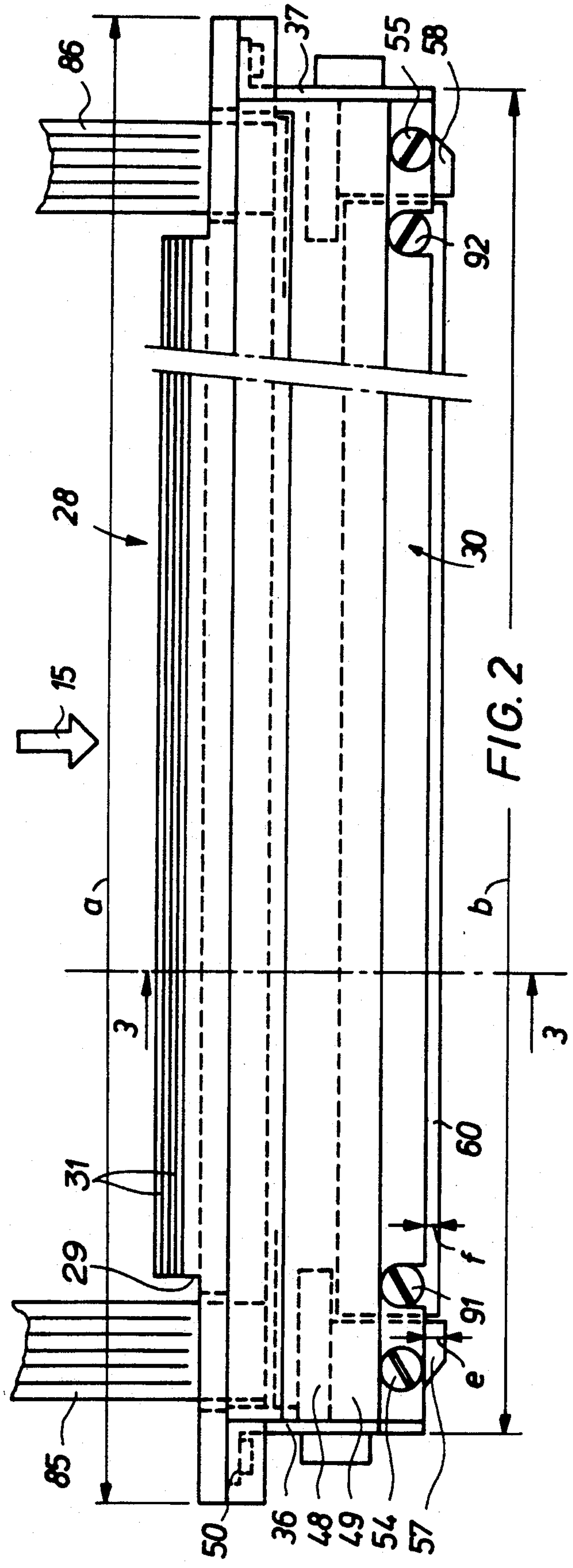
Figure 3:
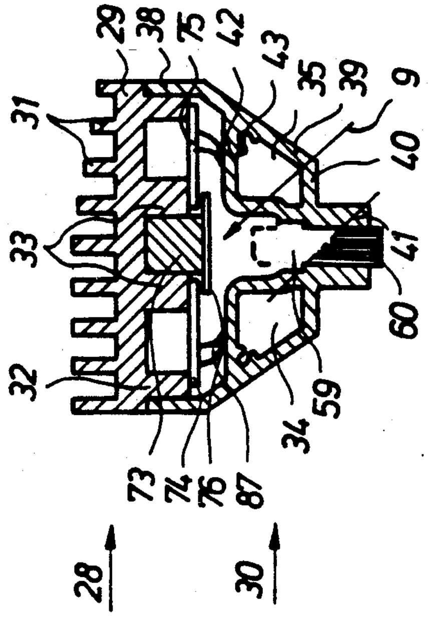
Figure 4:
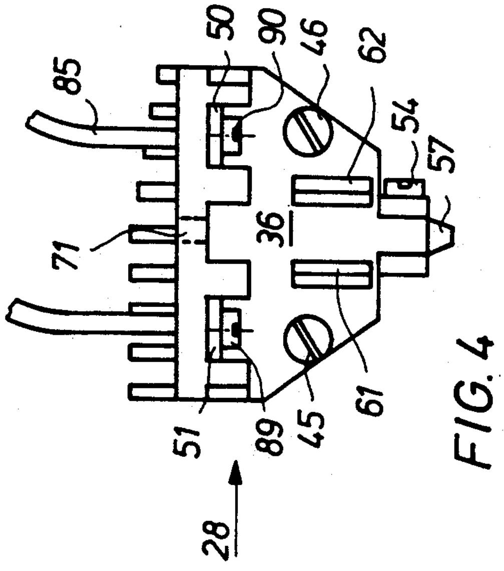
Figure 5:
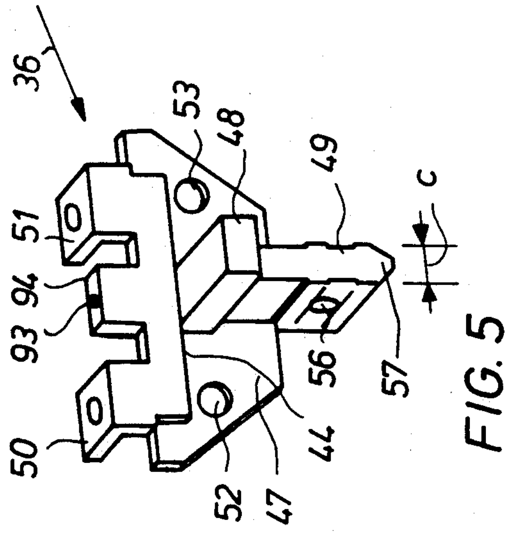
Figure 6:
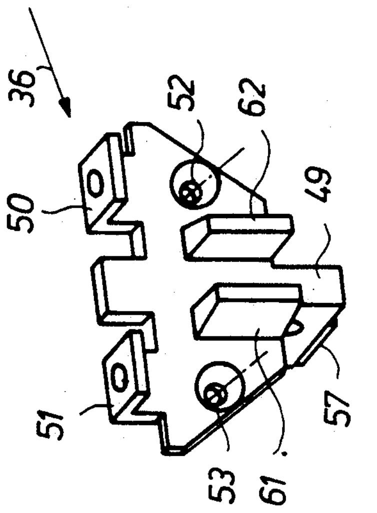
Figure 7:
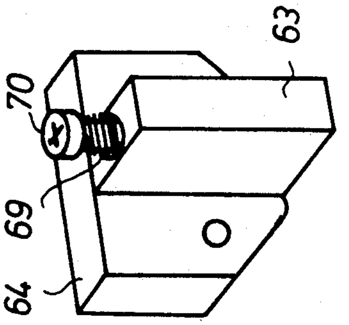
Figure 8:
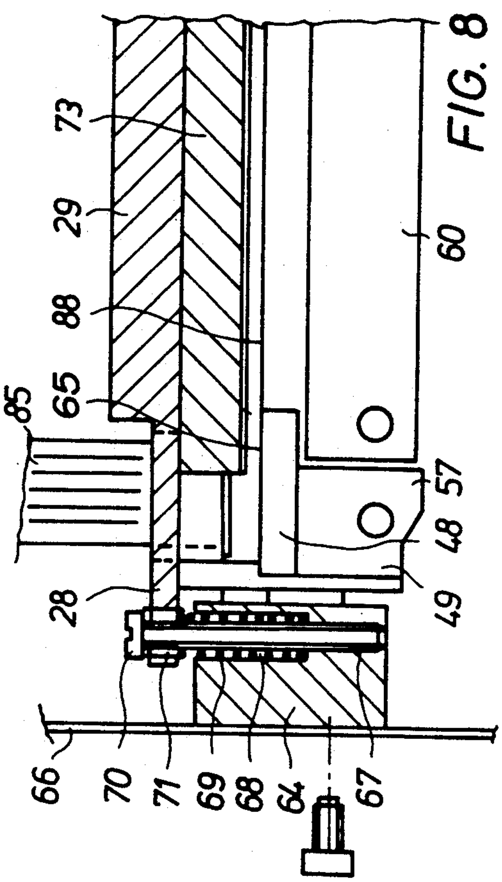
Figure 9C:
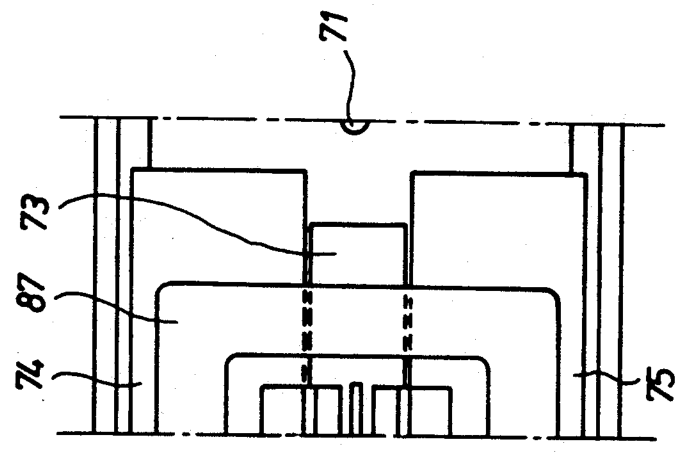
Figure 9B:
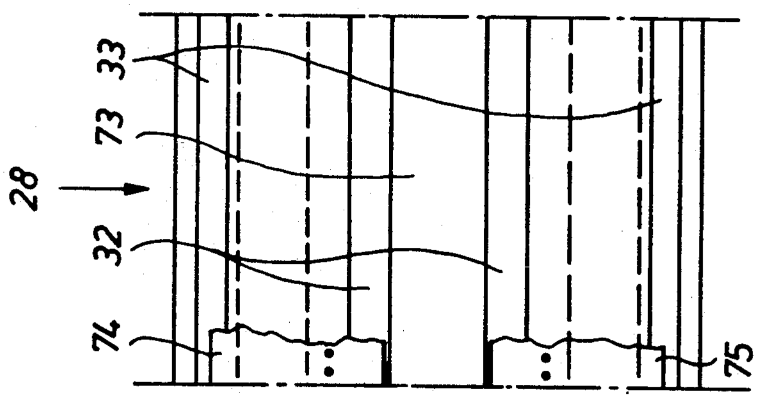
Figure 9A:
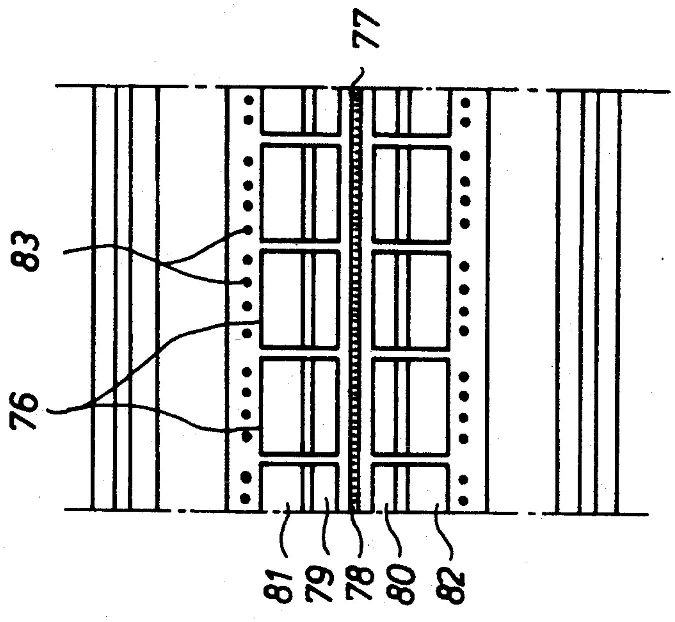

These and still further aspects will be explained hereinafter more in detail in the description hereinafter by way of example, with reference to the accompanying drawings wherein:

FIG. 1 is a diagrammatic view of the engine of a xerographic recording apparatus, FIG. 2 is a lateral elevation of one embodiment of an exposure head according to the present invention, FIG. 3 is a cross-section according to line 3—3 of FIG. 2, FIG. 4 is an end elevation of the exposure head, FIG. 5 is a perspective view of an end member, seen from the inside of the exposure head, FIG. 6 is a perspective view of an end member, seen from the outside of the exposure head, FIG. 7 is a perspective view of a mount for the exposure head, FIG. 8 illustrates the adjustment mechanism at one end of the exposure head, and FIG. 9 is a partial view according to the arrow 9 of FIG. 3.

Referring to FIG. 1, the arrow 10 illustrates generally the "engine" of a xerographic printer. The term "engine" denotes the components of the apparatus that are involved in the production of the image. It is clear that a printer comprises in practice a plurality of other parts such as a paper supply, a toner supply, a fixing station, drive means for rotation of the drum and for the paper transport, a toner fixing station, an electronic control circuit etc. These parts are known in the art and are irrelevant to the understanding of the further description of the present embodiment of the invention.

The engine comprises a photoconductor drum 12 which may be an aluminium cylinder coated with a photosensitive photoconductor, and which is rotatably in the direction of the arrow 13. Around the drum are provided the following stations in angularly spaced relationship.

A corona discharge station 14 which is used to uniformly electrostatically charge the surface of the drum 12.

An exposure head 15 for the line-wise exposure of the charged surface of the photoconductor drum as its surface moves past the head.

A color developing unit 16 which is arranged for applying colored toner to the line-wise discharge drum surface by means of a developer sleeve 17, also called a magnetic brush.

A black developing unit 18 which is arranged for applying a black toner to the charge pattern on the drum by means of a developer sleeve 19.

A paper feed channel 20 through which a paper sheet is fed into contact with the drum for receipt of the toner image formed on the drum.

A corona transfer station 21 which applies a corona charge of a size opposite to that of the toner to the underside of the paper to attract the toner from the drum onto the paper to form a visible, developed image.

A paper separation station 23 which applies charges to the paper so that it can be easily separated from the drum.

A paper separator 24 which ensures that the paper sheet is reliably separated from the drum.

A cleaning blade 25 for scraping off the residual toner left on the surface of the photoconductor drum after completion of the image transfer. This toner may then by conveyed to the toner collection bottle of the apparatus.

Finally, a main erase 26 which has a lamp 27 for neutralising any residual charge remaining on the surface of the photoconductor drum after cleaning.

In the operation of the engine, the exposure head 15 receives a first image signal to produce on the photoconductor drum 12 a charge pattern that will be developed by the black developing unit 18. The paper sheet that is removed by the separator 24 is passed through a toner fixing station which operates to melt the toner image into the paper sheet. The paper sheet is then returned by an appropriate conveyance mechanism to the feed entry 20 for receiving a second toner image from the photoconductor drum, this time the color image produced by the station 16 and by appropriate exposure of the head 15. An example of the use of the described two-color development is a letter or advertising sheet the surface of which bears a conventional black-and-white text, and the heading and/or the bottom of which bear(s) a colored company logo.

The illustration of FIG. 1 shows that the different stations around the photoconductor drum are located in closely angularly spaced relationship. The two developing stations in particular occupy quite an important part of the angular space around the photoconductor drum. The only unit which readily lends itself in practice to a reduction of its angular size without impairing the satisfactory operation of the printer, is the exposure head. The problem of angular space becomes particularly stringent in the case photoconductor drums of a relatively small diameter, that is a diameter smaller than approximately 80 mm, are used.

The present embodiment of the exposure head, which offers a very compact unit of inexpensive construction, is described hereinafter in detail with reference to FIGS. 2 to 4. FIG. 2 is a lateral elevation, FIG. 3 is a cross section of line 3—3 of FIG. 2, and FIG. 4 is an end elevation of the exposure head 15 of FIG. 1.

The head is mounted within a housing which is composed of a base section 28 and a cover 30. The base is an extrusion-moulded elongated metal section 29 of a light metal alloy, such as aluminium, which has a plurality of cooling fins 31 at the outside and four rectangular rigs, viz. two outer 32 and two inner ribs 33 at the inside of the head.

The cover 30 is an assembly of two extrusion-moulded elongated metal side wall sections 34 and 35 of a light metal alloy which are assembled by means of end members 36 and 37. The section 35 is identical to section 34 but has been placed in a reversed position with respect to section 34. The side wall sections 34 and 35 each have a beam-like structure with as illustrated for the section 35 in FIG. 3. Thus, the side wall sections include first margins 38 seated against the opposite side walls of the base section, second margins 41 disposed in proximate spaced apart relation to one another to define therebetween a slot-like opening 59 for receiving an elongated lens array 60, and between the first and second margins sloping or inclined portions 39, which converge toward one other, the inclined portions being joined to the second margins by a portion 40 running parallel to the plane of the base section 29. In addition, a shoulder 42 projects from each of the mutually facing surfaces of the inclined portions 39 partially inwardly of the cover in generally parallel relation to the plane of the base section, being extended at its inner edge generally perpendicular to such plane for connection to a parallel portion 40. The interior corner between each of the inclined wall portions 39 and 42 and the corresponding shoulder is provided with two receiving a self-tapping screw for the assembling of the cover. These self-tapping screws are illustrated in FIG. 4 as 45 and 46 for fixing the end member 36 to one end of the two sections of the cover.

The advantage of the tapered configuration of the exposure head is that it requires less angular space around the photoconductor drum than a conventional head with a square cross-section as illustrated in broken lines 11 in FIG. 1.

The length of the base is indicated by a and of the cover by b in FIG. 2.

The two end members 36 and 37 are injection moulded parts that are identical to each other. The member 36 is illustrated in detail in the perspective views of FIGS. 5 and 6, FIG. 5 being a view from the inside and FIG. 6 from the outside of the head.

The end member 36 has a generally truncated triangular end wall 47 with an inwardly projecting leg 48 and a downwardly projecting leg 49, and outwardly projection lugs 50 and 51. The width c of the leg 49 is such that it determines the correct spacing between both cover sections 34 and 35 by fitting against the opposed faces of the walls 41, see FIG. 3.

The member 36 has a shoulder 44 against which the ends of the walls 42 abut.

The self-tapping screws 45 and 46 pass through bores 52 and 53 for engagement in the corresponding channels 43 of the sections 34 and 35.

The fitting of the end members is finally completed by screws 54 and 55, see FIG. 2, through bores such as 56 in member 36, whereby the opposed walls 41 of each section of the cover are tightly clamped against the legs 49 of the end members.

The leg 49 of the end member 36 has a protuberance such as 57 and the leg of end member 37 a protuberance 58 (FIG. 2) which projects beyond the end of slotlike opening 59 of the cover formed between the sections 34 and 35 over a distance 3 which is larger than the distance f over which the elongated lens 60 protrudes out of said opening, see FIG. 2.

The purpose of said protuberances is to form a protective stop which comes into contact with a workdesk of surface like onto which the exposure head may be disposed, and which thereby prevent direct contact of the outer face of the lens array with such desk.

Each end member has further at its outer face two guide tog tongues 61 and 62 with parallel guide surfaces which cooperate with the opposed guide faces of a leg 63 that projects from opposed mounts, or mounting blocks one mount being illustrated as 64 in FIG. 7, which are mounted against the inner side of the opposed lateral walls of the apparatus such as the wall 66 in FIG. 8, for receiving the ends of the exposure head.

Each mount 64 has a screw-threaded bore 67, see FIG. 8, which merges into a widened bore 68 into which a helical compression spring 69 is housed, surrounding an adjustment screw 70. The adjustment screw 70 passes through a central bore 71 at the end of the base 28. It will be understood that the guides 61 and 62 ensure the displacement of the exposure head in a plane normal to the base plane, and also the passing of the optical axis 72 of the exposure head through the axis 65 of the photoconductor drum, whereas the axial position of adjustment screws ensures the correct distance from the head to the photoconductor drum.

The assembly of the housing of the exposure head is now described with reference to the construction of the electronic circuitry, which is described with reference to FIGS. 3 and 9, FIG. 9 being part of a plan view of the base of the opened exposure head, according to the arrow 9 of FIG. 3.

FIG. 9 illustrates in fact three sections, section A being a true plan view according to the arrow 9, section B showing the base with the LED modules omitted, and section C showing an end section of the exposure head.

The base 28 is provided, the inside being turned upwardly, with an elongate copper bar 73 which is fitted in the space between the two inner ribs 33 of the base by means of a thermally conductive adhesive that allows minor dimensional changes of the base and of the bar, caused by the heating of these elements during operation of the exposure head. The length of the bar 73 is slightly smaller than the length of the base so that space is left at the ends of the base for the location of the end members 36 and 37. The height of the bar exceeds the height of the ribs 33 so that it protrudes above the mounting surfaces determined by the ribs 32 and 33.

Then two elongated printed circuit strips 74 and 75 are disposed at either side of the bar 73 on the ribs 32 and 33. The correct position of the strip is obtained via small bores in the strip that fit over corresponding positioning pins upstanding from the base (not illustrated). For the ease of understanding, the strips 74 and 75 have been extended somewhat in the central section B of FIG. 9.

Then the different modules 76 are die-bonded in closely spaced side by side relationship to the bar 73 by means of an electrically and thermally conductive adhesive, such as a silver-filled epoxy adhesive.

Each module is in fact an assembly of the following on a tiny metal base plate.

A row of LED dice 78 with LED's 77, which lie along the center of the assembly, is cemented to the front face of the base plate by an electrically and thermally conductive adhesive. Typically, each dice is about eight millimeters long and about one millimeter wide.

On each side of the row of LED dice on each base plate there is a row of several integrated circuit chips 79 and 80, respectively, which are equally cemented in electrically and thermally conductive way to the base plate. The chips comprise the drivers for the LED's, a shift register, and occasional further control circuits.

Outboard of the row of integrated circuit ships on each side of the center line, there is a conventional thick film circuit on a ceramic base, such as 81 and 82, which is equally cemented to the base plate. The thick film circuits receive electric connections from the printed circuit strips 74 and 75 at connection points such as 83, but they also comprise trimming resistors, blocking capacitors and other discrete components, all well known in the art.

Wire bonded electric connections are provided between the LED dice 78 and the integrated circuit chips 79 and 80, and between the integrated circuit chips 79 and 80 and the thick film circuits 81 and 82.

The two printed circuit strips 74 and 75 have conventional flexible cable connectors such as 85 and 86 at each end (FIG. 2), so that four connectors in all leave the base through corresponding elongated openings provided at its ends. The ribs 31 are removed adjacent the ends of the base so as to stop short of these openings as can be seen in FIG. 2.

It will be noted that the printed circuit strips 74, 75 and the LED-modules 76 overlap each other to a certain extent. This has the advantage of a further reduction of the total width of the exposure head, and forms the subject matter of co-pending European patent application No. 90201779.9 filed on Jul. 3, 1990, bearing the title "LED exposure head with overlapping circuits".

The sealing of the exposure head against harmful environmental conditions is obtained as follows.

A preformed rectangular resilient bead 87 with a nearly triangular cross section is adhered with its elongate legs approximately centrally of the exposed surface of the printed circuit strips 74 and 75, as may be seen in the section C of FIG. 9, the transverse legs of the sealing bead adhering to the printed circuit strips and the copper bar 73 located therebetween. See also FIG. 2. The upper surface of the bar 73 and of the printed circuit strips 74 and 75 do not lie exactly in the same plane. This difference is compensated by the thickness of the adhesive by which the bead is secured.

Next, a thin protective layer of transparent silicone rubber is applied within the exposed surface of the rectangular sealing bead, thus covering all electric components, their wire bondings, etc.

Finally, the cover is placed on the base. The inner walls 42 of the two elongated sections 34 and 35 gently deform the resilient bead 87 whereby a good sealing between the contents between the cover and the base is obtained. The sealing contact near the ends of the cover is obtained by the face 65 (see FIG. 8) of the legs 48 of the end members which lies flush with the exposed surface 88 of the inner walls 42 of the cover, see FIG. 3. The fastening of the cover to the base occurs by means of screws 89 and 90 through the lugs of the end members, see FIG. 4.

Then, the lens array 60 is mounted within the slotlike opening 59 of the cover. See FIGS. 3 and 8 Correct adjustment of the lens with respect to the LED's may occur by projecting the image of the LED's on a suitable support enlarging this image by means of a microscope. Then the screws 91 and 92 (FIG. 2 are locked to tightly pull the lens array against one wall 41 of the opening 59. It will be understood that this causes a very slight deviation of the center of the lens array out of the center of the opening 59 and thus the focus line of the lens array no longer exactly coincides with the center of the LED's. It has been found that this deviation, in an order of magnitude ranging between 0.05 and 0.2 mm is favourable for the reproduction characteristics of the exposure head.

The completed exposure head may be tested for a number of hours at full power, and is then ready for mounting in the printer.

The assembled had has the advantage that it can at any time be re-opened, without destruction of any component for occasional inspection or cleaning of the head.

As the cover is replaced on the base, the lens array remaining in the cover, the lens will take exactly the same position as before since the opposed, inner faces of the ribs 33 of the cover precisely fit against the corresponding opposed faces of the square section (FIG. 5) of the end members. In addition, there may the cooperation between positioning pins on the base (not illustrated) and corresponding bores in the end members, such as the bore 93 in FIG. 5.

It will be understood that the present invention is not limited to the embodiment described hereinbefore.

The assembly of the cover may occur in using more than two elongated sections such as 36 and 37.

The cover may also be constituted by only one extrusion-moulded elongated section, the slotlike opening for the positioning of the lens array being in that case obtained by the milling of a slot in the section over the required length.

The LED arrays may comprise two rows of LED's, arranged in mutually staggered relationship for an increased image resolution, rather than one row as in the described example.

The LED modules may be cemented directly onto a suitable central rib of the base, rather than to a separate bar incorporated into said base.

The fastening of the end members to the cover sections may occur by means of an epoxy adhesive, instead of by screws.

The LED dice 78 and the integrated circuits 79 and 80 may be integrated in one chip.

The printed circuit strips 74 and 75 may be integrated in one single support which has a suitable elongated central opening for fitting over the bar 73.

The exposure head may occasionally comprise drivers, integrated circuits and thick film circuits on one side only of the row(s) of LED's, as in the case of exposure heads which comprise a limited number of LED's only for the production of an image with a reduced resolution.

I claim:

1. A light emitting diode exposure head for linewise recording information on a moving photoreceptor in a recording apparatus including at least one supporting wall for said head, said exposure head comprising a) a generally linearly aligned assembly of a plurality of light emitting diodes arranged in side-by-side relation on a common support and b) an elongated lens array parallel to said diode assembly, both of said assembly and said lens array being housed with c) a protective housing with the lens array exposed through the housing, said housing comprising an elongated extrusion molded generally planar base section on which said common support of said diode assembly is affixed, said base section being generally rectangular with opposite generally parallel side faces and opposite ends situated beyond ends of said diode assembly, a lengthwise elongated extrusion molded cover for said base section, said cover comprising a pair of opposed side walls extending lengthwise of said base section, said side walls each having first and second margins extending lengthwise in spaced apart generally parallel relation, the first margins of said side walls being each seated on a side face of said base section and the second margins of said sidewall being disposed in proximate spaced parallel relation to each other to define therebetween an elongated slot for receiving said lens array in general alignment with said diode assembly, said side walls between said first and second margins extending in inclined relation to said side faces of said base section and in converging relation to each other, whereby said cover has a generally truncated triangular cross-sectional configuration, said side walls terminating in opposite end edges generally adjacent to said opposite end of said base section, and injection molded end closure members anchored to the ends of said base section and the end edges of said cover side walls to hold the base section and the side walls into a unitary structure, and means at at least one of the ends of said base section for attaching the exposure head in recording position to a supporting wall of the recording apparatus.

2. An exposure head according to claim 1 wherein the length of said cover is less than the length of said base section, and each of said end closure members have lugs thereon projecting away from said base section for attachment of the end closure members to said base section.

3. An exposure had according to claim 1 wherein each of said end closure members includes a protuberance projecting away from said base section beyond said second margins of said cover side walls thereby to form a protection for the lens array received within said elongated slot defined by said second margins of said side walls.

4. An exposure head according to claim 1 wherein each of said side walls of the cover has a shoulder extending from a surface thereof facing said diode assembly that is generally parallel with a surface of the base section facing said cover.

5. An exposure head according to claim 1 wherein said common support for the diode assembly is a bar of thermally and electrically conductive material with a rectangular cross-section.

6. An exposure head according to claim 1 wherein said base section carries on each of two opposite sides of said common support for the diode assembly a circuit board supporting an array of electronic circuit components associated with said diodes, and a bead of resilient sealing material is disposed between each said circuit board and a surface of each of said side walls of said cover facing said assembly of diodes to form a seal therebetween.

7. An exposure head according to claim 1, wherein said base section has on a side thereof facing said cover a plurality of ribs extending substantially the length of said base section, an interior pair of said ribs defining a channel for receiving the common support for said diode assembly, and one of said ribs being situated adjacent each of the side faces of the base section for seating of the first margins of sides walls of said cover.

8. An exposure head according to claim 7 wherein said common support for said diode assembly is a bar of electrically and thermally conductive material which is secured to said base section by a thermally conductive adhesive.

9. An exposure head according to claim 8 wherein printed circuit strips cooperating with said diodes are arranged on said ribs, and an exposed surface of said bar and on exposed surface of said printed circuit strips lie in different planes.

10. An exposure head according to claim 7 wherein said base section is provided with an opening adjacent at least one of said opposite ends of said base section for the passage of electrical connectors into the head, and the base section has on surface thereof facing away from said cover a plurality of longitudinal cooling fins which terminate short of each said opening.

11. An exposure head according to claim 1 wherein at least said one supporting wall of said recording apparatus has a mounting block thereon provided with guide surfaces and at least one of said end closure members has parallel guide tongues projecting therefrom for cooperating engagement with said guide surfaces to guide said recording head for displacement relative to said supporting wall in a direction perpendicular to the plane of said base section.

12. An exposure head according to claim 11 wherein said means at at least said one end of said base section for attaching the exposure head to said supporting wall of said recording apparatus comprises an extension projecting from one of said base section opposite ends away from said cover beyond one of said end closure members at said one of said opposite ends wherein said extension is adjustably connected to said mounting block on said supporting wall by an adjustment screw passing through said extension generally perpendicular of the plane of said base section and having a head abutting a surface of said extension and an end opposite said screw head in threadwise engagement with said mounting block, and compression spring means between said base section extension and said mounting block for urging said extension and said block apart in a direction of the screw axis.

13. An exposure head according to claim 1 wherein each of said end closure members has a tongue projecting therefrom between said second margins of the cover side walls adjacent the end edges of said side walls for determining a spacing between the second margins of said side walls and thereby fix a width of the slot defined by said second margins.

* * * * *

UNITED STATES PATENT AND TRADEMARK OFFICE
CERTIFICATE OF CORRECTION

PATENT NO. : 5,235,348

DATED : August 10 ,1993

INVENTOR(S) : KRIS P. AVONTS

It is certified that error appears in the above-identified patent and that said Letters Patent is hereby corrected as shown below:

Col. 8, line 36, before "c)", change "with" to --within--.

Col. 10, line 4, change "on" to --an--.

Col. 10, line 10, before "surface", insert --a--.

Signed and Sealed this

Fifth Day of April, 1994

Attest:

BRUCE LEHMAN

Attesting Officer

*Commissioner of Patents and Trademarks*